United States Patent

Basavanhally

[11] Patent Number: 5,221,417
[45] Date of Patent: Jun. 22, 1993

[54] CONDUCTIVE ADHESIVE FILM TECHNIQUES

[75] Inventor: Nagesh R. Basavanhally, Trenton, N.J.

[73] Assignee: AT&T Bell Laboratories, Murray Hill, N.J.

[21] Appl. No.: 838,650

[22] Filed: Feb. 20, 1992

[51] Int. Cl.⁵ .................. B29C 65/02; H01B 7/08
[52] U.S. Cl. .................. 156/629; 156/659.1; 156/300; 156/306.6; 174/117 A
[58] Field of Search .............. 156/629, 659.1, 901, 156/625, 52, 300, 306.6; 174/117 A; 264/24, 272.11, 272.15, 272.13, 279.1

[56] References Cited

U.S. PATENT DOCUMENTS

| | | | |
|---|---|---|---|
| 3,128,544 | 4/1964 | Allingham . | |
| 3,132,204 | 5/1964 | Giellerup | 174/117 A |
| 4,170,677 | 10/1979 | Hutcheson | 156/272.4 X |
| 4,201,435 | 5/1980 | Nakamura et al. | 339/59 |
| 4,209,481 | 6/1980 | Kashiro et al. | 264/272.11 X |
| 4,292,261 | 9/1981 | Kotani et al. | 264/24 |
| 4,546,037 | 10/1985 | King | 174/117 A X |
| 4,548,862 | 10/1985 | Hartman | 174/117 A X |
| 4,554,033 | 11/1985 | Dery et al. | 156/291 X |
| 4,729,809 | 3/1988 | Dery et al. | 156/298 X |
| 4,744,850 | 5/1988 | Imano et al. | 174/117 A X |
| 4,778,635 | 10/1988 | Hechtman et al. | 264/24 |
| 4,857,482 | 8/1959 | Saito et al. | 264/272.11 X |
| 4,902,857 | 2/1990 | Cranston et al. | 174/94 |
| 4,923,739 | 5/1990 | Jin et al. | 174/117 A X |
| 4,931,598 | 6/1990 | Calhoun et al. | 174/117 A X |

OTHER PUBLICATIONS

"Packaging Ideas," *Electronic Packaging & Production*, edited by H. Markstein, Oct. 1990, p. 47.

*Primary Examiner*—Thi Dang
*Attorney, Agent, or Firm*—Roderick B. Anderson

[57] ABSTRACT

In one embodiment of the invention, photolithographic masking and etching is used to form a matrix array of mutually isolated ferromagnetic elements (25'). The elements are magnetized and a single layer of conductive ferromagnetic particles (33) is adhered to an upper surface of each of the ferromagnetic elements. The layer of particles is contacted with a layer of soft adhesive polymer (36) to cause penetration of the particles into the polymer. The adhesive polymer is then hardened to assure containment of the particles in the polymer. The hardened adhesive polymer is removed and located between the first and second conductor arrays (40-43) that is to be interconnected; for example, it is located between the bonding pads (43) of a chip (42) and the bonding pads (40) of a substrate (39) to which the chip is to be connected. The adhesive polymer is then softened by heating and compressed between the first and second conductor arrays to cause it to adhere to the conductor arrays and to interconnect them and is thereafter hardened to form a unified structure.

17 Claims, 5 Drawing Sheets

CONDUCTIVE ADHESIVE FILM TECHNIQUES

TECHNICAL FIELD

This invention relates to techniques for making electrical interconnections to electronic devices and, more particularly, to such methods which use conductive adhesives for bonding an electronic device to a substrate and for providing electrical interconnection between the device and a substrate.

BACKGROUND OF THE INVENTION

Considerable work has been expended in improving techniques for bonding integrated circuit chips to conductive circuit patterns supported on a substrate. One such method uses an anisotropically conductive adhesive between bonding pads on the substrate and matching bonding pads of the integrated circuit chip. The adhesive is typically an insulative polymer containing conductive particles that simultaneously contact the pad of the chip and the pad of the substrate to provide interconnection. The conductive particles do not provide any significant lateral or horizontal conduction; since they transmit current only in the vertical direction between substrate and device bonding pads, the conduction is referred to as "anisotropic." The adhesive of the polymer is cured after mounting of the chip on the substrate which thereafter provides a permanent structural bond in addition to a conductive interconnection. High component density and bonding pad densities can be accommodated by conductive adhesives, and their use generally reduces assembly costs.

Anisotropic conductive adhesives are particularly promising for reducing the cost of bonding chips having a high density of bonding pads spaced only a very small distance from the bonding pads of the substrate. For example, if they could be used for interconnecting bonding pads spaced only about fifteen microns from substrate bonding pads, with the dimensions of the bonding pads being on the order of only one hundred microns on a side, assembly costs could be considerably reduced compared to other methods, and the losses due to inductance through the connections could be reduced because of the close spacing. The copending patent application of N. R. Basavanhally and B. H. Cranston, Ser. No. 07/735,231, filed Jul 24, 1991, is directed to a method for compensating for differences in conductive particle diameter when interconnecting bonding pads of such small dimension.

Even with the improvement of the Basavanhally et al. patent application, conductive interconnection has not proven to be as reliable as would be desired. The distribution of the particles throughout the conductive adhesive is sometimes not reliable. If the particles are too thinly distributed in an area, they may not interconnect matching bonding pads; if they are too thickly distributed, spurious lateral conductive paths may be established which can lead to short circuit in the structure.

Accordingly, there has been a continuing long-felt need for conductive adhesive techniques that can provide reliable conduction and bonding, especially for bonding small-area bonding pads of integrated circuits with matching bonding pads of a substrate.

SUMMARY OF THE INVENTION

In accordance with one embodiment of the invention, photolithographic masking and etching is used to form a matrix array of mutually isolated ferromagnetic elements. The elements are magnetized and a single layer of conductive ferromagnetic particles is adhered to an upper surface of each of the ferromagnetic elements. The layer of particles is contacted with a layer of soft adhesive polymer to cause penetration of the particles into the polymer. The adhesive polymer is then hardened to assure containment of the particles in the polymer. The hardened adhesive polymer is removed and located between the first and second conductor arrays that is to be interconnected; for example, it is located between the bonding pads of a chip and the bonding pads of a substrate to which the chip is to be connected. The adhesive polymer is then softened by heating and compressed between the first and second conductor arrays to cause it to adhere to the conductor arrays and to interconnect them and is thereafter hardened to form a unified structure.

The method can be used to bond and interconnect an integrated circuit chip having a complex array of bonding pads to a matching array of bonding pads of a substrate. The cost of making this assembly in a reliable manner is lower than other surface mount techniques which normally involve soldering of all of the bonding pads to be interconnected. These and other objects, features, and advantages of the invention will be better understood from a consideration of the detailed description taken in conjunction with the accompanying drawing.

DETAILED DESCRIPTION

Figure 1:
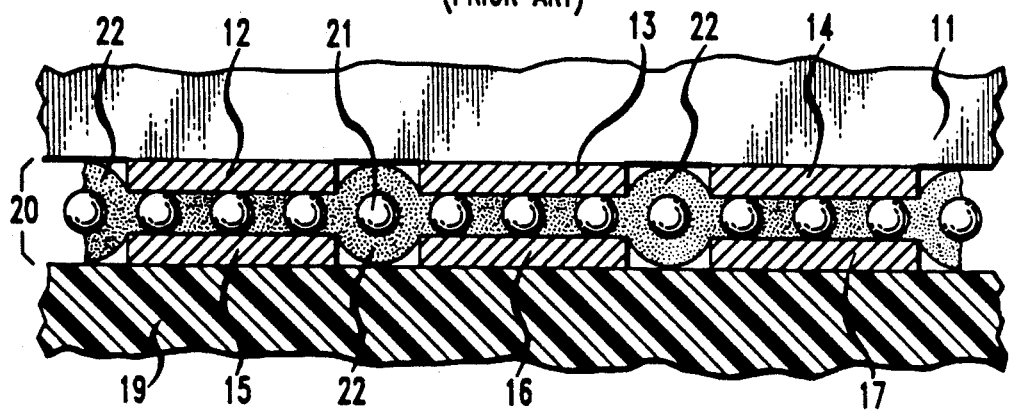
FIG. 1 is a partially sectional schematic view of a structure bonded by an anisotropic conductive adhesive in accordance with the prior art.

The drawings are intended to be schematic and not to scale, and certain of the dimensions are distorted to aid in clarity of exposition. Referring now to FIG. 1, there is shown a technique for using anisotropic conductive adhesive to bond an integrated circuit chip to the conductive pattern of a substrate in accordance with the prior art. An integrated circuit chip 11 comprises a plurality of bonding pads 12, 13 and 14 which are to be permanently connected to bonding pads 15, 16 and 17 of a substrate 19. The substrate 19 may be a printed circuit to which it is desired to bond the integrated circuit 11 in accordance with the principles of flip-chip surface mounting. The bonding and interconnection is done by a conductive adhesive 20 which comprises a plurality of conductive spheres or particles 21 contained in an insulative adhesive 22.

The insulative adhesive 22 may be a polymer matrix which is applied to the substrate 19 in a fluid or partially cured state, whereupon the integrated circuit 11 is pressed down in contact with it, as shown. The downward pressure causes the conductive adhesive 20, and component conductive particles 21, to distribute laterally. Next, the adhesive 22 is cured by heating to become solid and to permanently bond the bonding pads 12, 13 and 14 to the matching bonding pads 15, 16 and 17. The conductive particles thereafter provide anisotropic conduction between the conductive particles. That is, it is intended that they provide conduction only in the vertical direction between the matching bonding pads and that they do not conduct in the horizontal direction.

One can appreciate that reducing the space between matching bonding pads such as bonding pads 12 and 15 reduces the inductances of the transmission paths provided by the particles 21. Moreover, as the size of the bonding pads is reduced to accommodate greater conductor density and microminiaturization of the integrated circuit, the size of the particles 21 must necessarily become smaller. For example, conductive particles having a nominal diameter of fourteen microns are appropriate for interconnecting matching bonding pads having a separation on the order of fourteen microns. For this purpose, solid metal balls of nickel coated with silver have been found to be appropriately conductive to be capable of transmitting relatively high current densities with relatively low inductance.

The illustrated uniform distribution of the particles 21 is idealized and cannot be reliably obtained in practice. If the particles are nonuniformly distributed, there may be no particles interconnecting matching bonding pads, giving the structure spurious open circuit. If the particles are too thickly agglomerated in one area, they may provide a conductive path in the horizontal direction which could give a spurious short circuit between horizontally adjacent bonding pads. The method of making the conductive adhesive illustrated in FIGS. 2–10 overcomes these problems.

Figure 2:
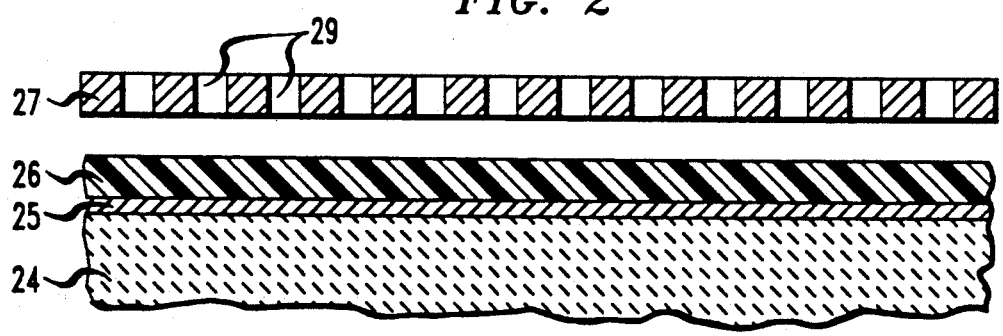
FIGS. 2, 3 and 4 illustrate successive steps in forming a ferromagnetic matrix in accordance with the invention.
Figure 3:
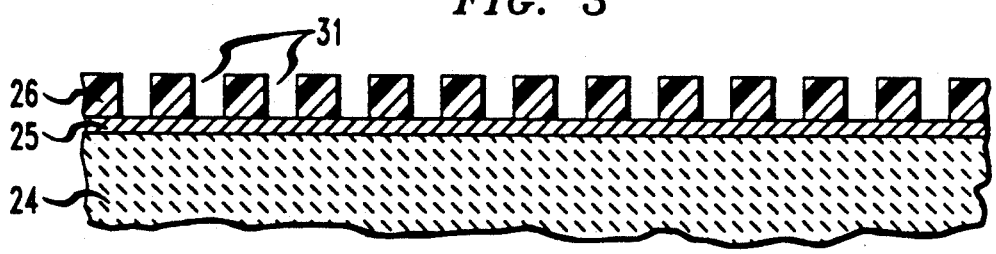

Referring now to FIG. 2, there is shown a substrate 24 containing on an upper surface a layer 25 of ferromagnetic material. Overlying the layer 25 is a layer 26 of photoresist and a photolithographic mask or photomask 27. Actinic light is transmitted only through apertures 29 in the photomask 27 to selectively expose the photosensitive layer 26. Referring to FIG. 3, development of the photoresist film illustratively comprises selective etching of those portions of the film that were exposed to light, thereby leaving an arrangement of apertures 31 in the photoresist film 26 corresponding to the location of the apertures 29 in FIG. 2.

Figure 4:
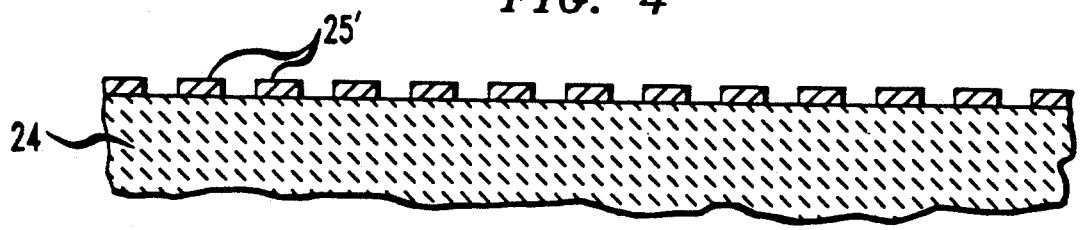

The next step is to selectively etch the ferromagnetic layer 25 with an etchant of the ferromagnetic layer that does not etch through the photoresist etch mask 26. Thus, only those portions exposed by apertures 31 are etched, leaving an arrangement of ferromagnetic elements 25' as shown in FIG. 4. After defining the elements 25', the photoresist layer is removed by selective etching.

Figure 5:
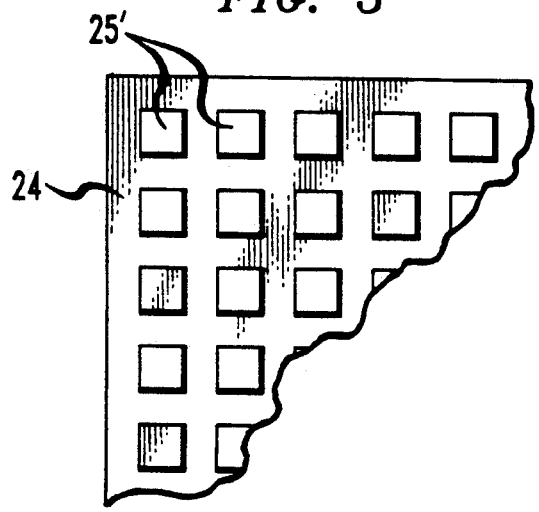
FIG. 5 is a top view of the ferromagnetic matrix of FIG. 4.

In accordance with the invention, the ferromagnetic elements 25' are formed so as to constitute a matrix array, a part of the top view of which is shown in FIG. 5. For reasons that will become clear later, each element 25' has a much smaller area than the area of a bonding pad to be interconnected by the anisotropic conductive film to be made. For example, each ferromagnetic element 25' may be twenty-five microns on a side and each separated by twenty-five microns, while the bonding pads are one hundred microns on a side (four mils) and separated by one hundred microns. Photolithographic masking and etching of some sort is required for making ferromagnetic elements this small.

Figure 6:
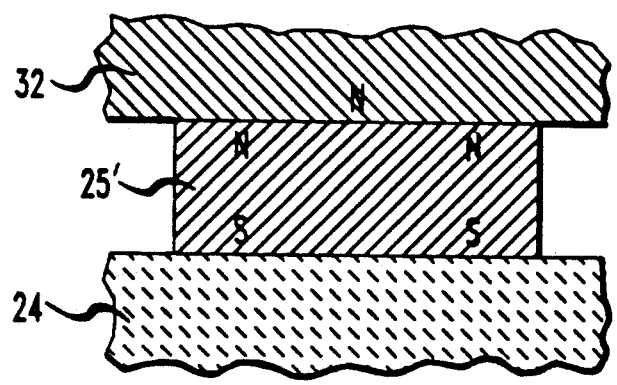
FIG. 6 is a schematic view of a method for magnetizing the magnets of FIG. 4.

Referring to FIG. 6, the ferromagnetic elements 25' are next magnetized. For example, they can be permanently magnetized with the polarity shown by bringing them into contact with a permanent magnet 32 as shown.

Figure 7:
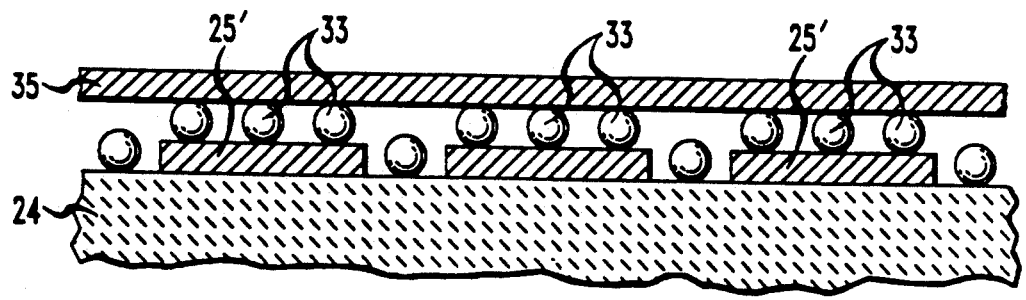
FIG. 7 shows a method for distributing conductive particles on elements of the ferromagnetic matrix of FIGS. 4 and 5.

Referring to FIG. 7, after magnetization of the ferromagnetic elements 25', ferromagnetic conductor particles 33 are placed over the ferromagnetic elements. Because of the magnetization, there is a tendency for the balls or particles to collect on the surface of each element. As will become clear later, it is desirable that only a single layer of the particles 33 be included on the surface of the elements, and for this reason it is preferred that a planar member 35 be compressed against the particles as shown by the arrow to remove any second or third layer of particles that may have collected on the ferromagnetic elements 25'. Such excess particles may fall to the surface of the substrate 24 as shown.

Figure 8:
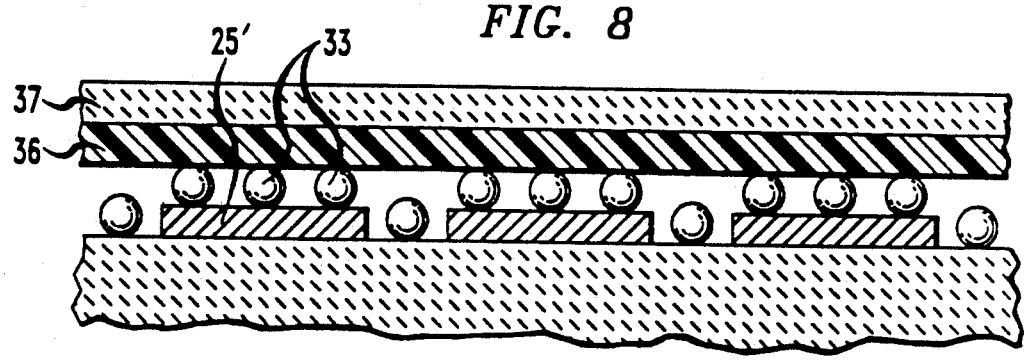
FIG. 8 illustrates a step subsequent to that of FIG. 7 for adhering the conductive particles of FIG. 6 on an adhesive sheet.
Figure 9:
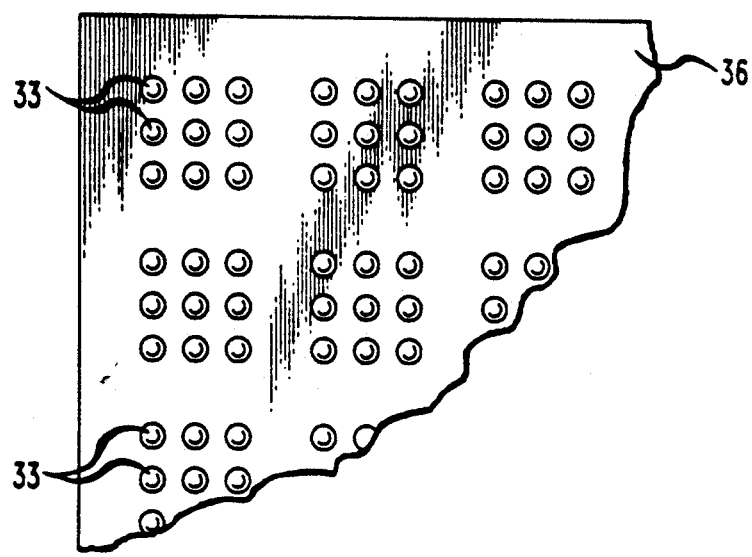
FIG. 9 is a top view of conductive particles distributed on the adhesive sheet of FIG. 8.

Referring to FIG. 8, the particles 33 are brought into contact with an adhesive layer 36 carried on a substrate 37. Before or during contact with the particles 33, the adhesive is heated to be in a softened or partially cured condition and downward pressure is exerted by substrate 37. As a consequence, the particles 33 penetrate the adhesive layer 36 and adhere thereto. Thereafter, the layer 36 is cured or hardened, whereupon it is removed from the ferromagnetic elements 25' and contains within it the particles 33 that were originally on the upper surfaces of ferromagnetic elements 25'. After removal of the adhesive layer 36, the particles 33 form a pattern in the adhesive 36 as is illustrated in FIG. 9. The pattern of course conforms to the pattern of the ferromagnetic elements 25' of FIG. 5. As mentioned before, each set or group of the particles 33 is smaller than the dimensions of a bonding pad.

Figure 10:
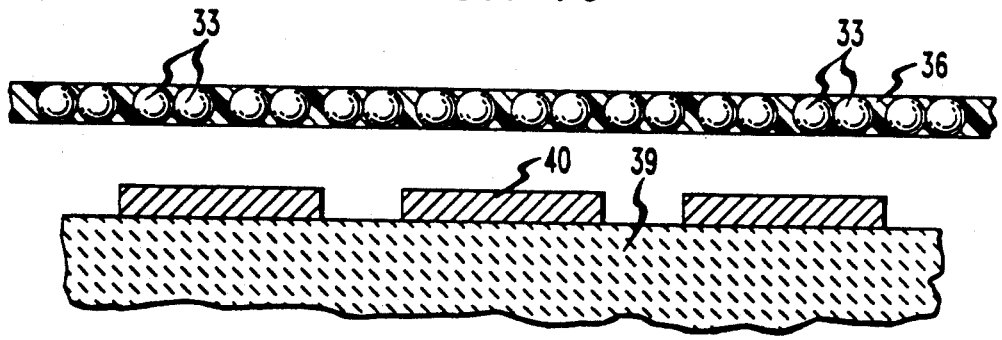
FIG. 10 is a view illustrating the application of a conductive adhesive sheet to a substrate.
Figure 11:
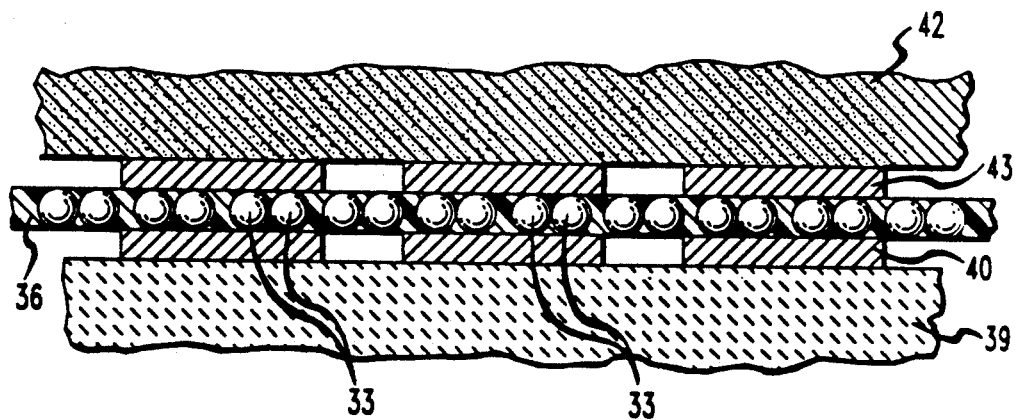
FIG. 11 is a schematic view showing the use of the conductive adhesive sheet of FIG. 10 to bond an integrated circuit to a substrate.

Referring to FIG. 10, the adhesive 36 is stripped from substrate 37 and, containing the embedded particles 33, is placed over a substrate 39 containing a bonding array, only one bonding pad 40 of which is shown. Referring to FIG. 11, after placement of the hardened adhesive layer 36 over bonding pad 40, a semiconductor integrated circuit 42 containing another bonding pad array that matches the array on substrate 39 is brought into contact with the adhesive 36 such that each bonding pad 43 of the integrated circuit overlies a matching bonding pad 40 of the substrate 39. It can be appreciated that regardless of how the adhesive layer 36 is positioned, as long as it is interposed between bonding pads 40 and 43, there will be a plurality of metal particles 33 between the bonding pads to give anisotropic conduction.

With the illustrative dimensions given, at least four groups, or at least sixteen conductive particles will be located between each pair of bonding pads. After the integrated circuit 42 has been placed such that its bonding pads overlie those of a substrate, the adhesive 36 is heated to soften it so that it adheres to and bonds together the bonding pads 40 and 43 along with the other matching bonding pads of the substrate and the integrated circuit to yield a structure such as that shown in FIG. 1.

Figure 12:
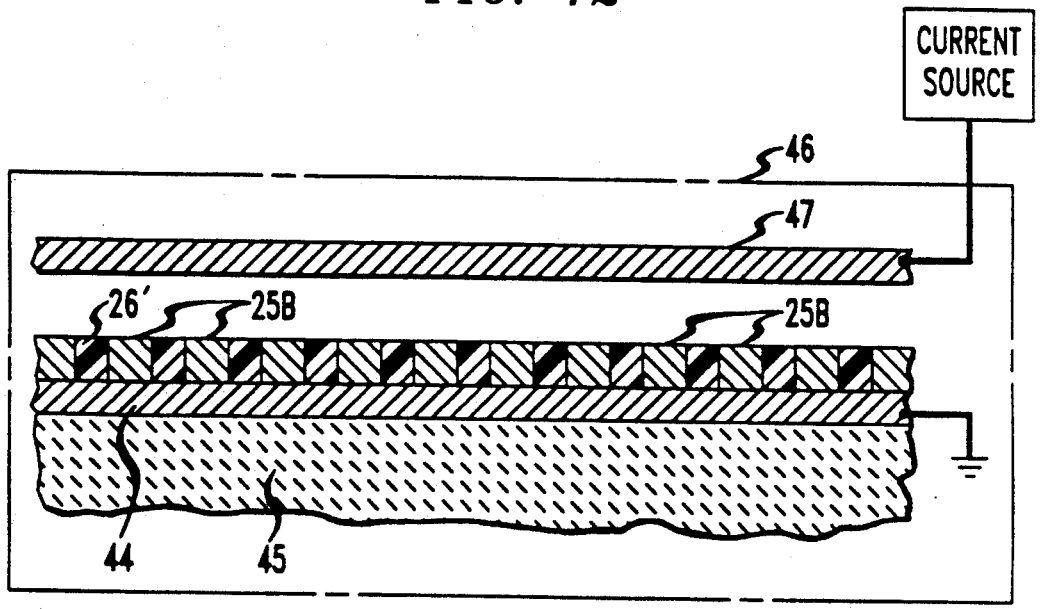
FIG. 12 is a schematic view showing an alternative way of making the ferromagnetic elements of FIG. 4.

Referring to FIG. 3, the photosensitive mask 26, rather than being used to control selective etching, can be used to control selective plating. This alternative method is shown in FIG. 12 in which a conductive layer such as copper 44 is located on a substrate 45. Overlying the copper layer is a photoresist layer 26' that has been patterned as described above to have a matrix array of openings. The openings, however, define the areas in which the ferromagnetic elements are to be located, rather than the locations at which they are to be etched. The structure is then contained in a plating bath 46 containing an electrode 47. An appropriate current and an appropriate bath can then be used to electroplate ferromagnetic portions 25B in openings of the photoresist layer 26'. The ferromagnetic portions may illustratively be nickel and iron at a ratio of eighty to twenty. Thereafter, the plating mask 26' is etched away to yield the structure that operates as shown in FIG. 7.

Figure 13:
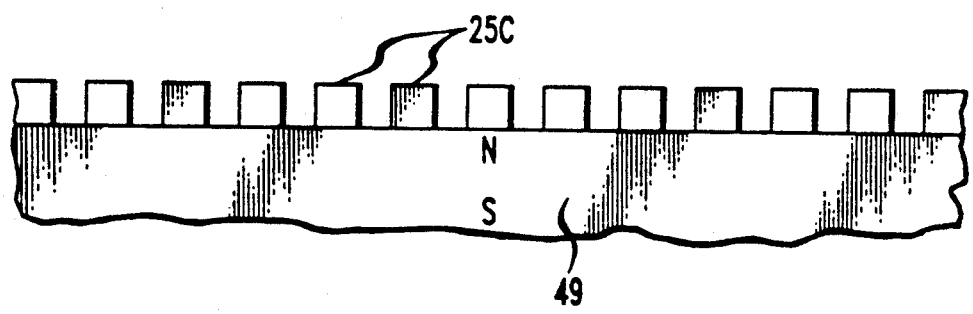
FIG. 13 illustrates other modifications that can be made to the structure of FIG. 4.

Rather than permanently magnetizing the ferromagnetic elements as shown in FIG. 6, the ferromagnetic elements may constitute flux concentraters or pole pieces 25C as illustrated in FIG. 13. That is, each of the ferromagnetic elements 25C constitutes a flux concentrater of a magnet 49 which may itself be either a permanent magnet or an electromagnet. With the polarity shown, the ferromagnetic elements 25C operate in the same manner as the ferromagnetic elements 25' of FIG. 7 to attract and contain on their upper surfaces the conductive ferromagnetic particles 33.

The adhesive 36 that is used for the anisotropic conductor layer may be made by mixing one part by weight of butylated urea formaldehyde resin (solids) to three parts by weight of phenoxy resin (solids) in a solvent such as butanol xylene. The adhesive can be softened by heating to one hundred to two hundred degrees Centigrade and solidified by cooling to room temperature, as is known in the art. The substrate 37 of FIG. 8 that carried the adhesive may be mylar which can easily be stripped after the adhesive has been hardened. The conductive ferromagnetic particles may be silver clad nickel spheres having nominal diameters of fourteen microns, available from Potters Industries, Parsippany, N.J. The bonding illustrated in FIG. 11 may be made by applying a downward force on integrated circuit chip 42 which translates as a pressure of forty to fifty pounds per square inch on each of the bonding pads 43.

In addition to assuring conduction between each pair of matching bonding pads, the conductive particle arrays of FIG. 9 assure that there is no spurious lateral conduction; this is done by purposely providing a space between each group of particles. The spacings described are only illustrative, but the invention is intended for use with bonding pads having small dimensions such as length and width dimensions of less than one hundred fifth microns. The ferromagnetic particles should have a diameter of less than about twenty-five microns and the ferromagnetic elements 25' of FIG. 5 should have length and width dimensions of less than about seventy microns. With such small dimensions, photolithography is the only practical method for defining the ferromagnetic elements. In any event, it is preferred that each pair of bonding pads be interconnected by at least two groups of particles which requires that the area of each of the ferromagnetic elements 25' be less than half the area of each of the bonding pads 40 and 43 of FIG. 11. With the invention, reliable bonding and interconnection can be made at a significantly low cost than by competing soldering methods.

The various embodiments which have been described are intended to be only illustrative of the inventive concepts involved. Various other embodiments and modifications may be made by those skilled in the art without departing from the spirit and scope of the invention.

I claim:

1. A method for interconnecting a first conductor array of an electronic device to a second conductor array of a first substrate comprising the steps of:
   using photolithographic masking and etching to form a matrix array of mutually isolated ferromagnetic elements;
   magnetizing the ferromagnetic elements;
   causing a layer of ferromagnetic conductive particles to adhere to an upper surface of each of the ferromagnetic elements;
   contacting the layer of particles with a layer of softened adhesive to cause penetration of the particles into the adhesive;
   hardening the adhesive to cause containment of the particles therein;
   removing the hardened adhesive containing the particles and locating it between the first and second conductor arrays;
   softening the adhesive and compressing the adhesive between the first and second conductor arrays, thereby to cause it to adhere to the conductor arrays and causing individual particles to make simultaneous contact with conductors of the first and second conductor arrays to interconnect the electronic device to the first substrate.

2. The method of claim 1 wherein:
   the step of causing the layer of ferromagnetic conductive particles to adhere to upper surfaces of the ferromagnetic elements comprises the step of assuring that only a single layer of the ferromagnetic particles is formed on the surfaces.

3. The method of claim 1 wherein:
   the first and second conductor arrays respectively comprise first and second arrays of bonding pads that are interconnected by the adhesive;
   and each bonding pad of the first and second arrays has length and width dimensions of less than one hundred fifth microns.

4. The method of claim 3 wherein:
   each of the ferromagnetic elements has length and width dimensions of less than seventy microns.

5. The method of claim 4 wherein:
   each of the ferromagnetic particles has a diameter of less than about twenty-five microns.

6. The method of claim 5 wherein:
   the adhesive that adheres to the first and second arrays of bonding pads is a polymer having a thickness of less than about twenty-five microns.

7. The method of claim 1 wherein the means for forming a matrix array of mutually isolated ferromagnetic elements comprises the steps of:

forming a ferromagnetic layer on a second substrate;
forming over the ferromagnetic layer a photosensitive layer;
selectively exposing the photosensitive layer to light;
selectively etching the photosensitive layer to form a mask;
and using the mask to selectively etch the ferromagnetic layer, thereby to form the ferromagnetic elements.

8. The method of claim 1 wherein the method of forming the matrix array of mutually isolated ferromagnetic elements comprises the steps of:
forming on a second substrate a photosensitive layer;
selectively exposing the photosensitive layer to light;
selectively etching the photosensitive layer to form a mask;
and using the mask to selectively plate ferromagnetic material on the second substrate, thereby to form the ferromagnetic elements.

9. The method of claim 1 further comprising the step of:
during the adherence of the ferromagnetic conductive particles to an upper surface of each of the ferromagnetic elements, forcing a planar member downwardly onto the upper surface of the conductive particles, thereby to force the conductive particles to distribute as a single layer on the upper surface of each of the ferromagnetic elements.

10. A method for interconnecting a first bonding pad array of an electronic device to a second bonding pad array of a first substrate comprising the steps of:
distributing on an upper surface of a first body an array of mutually isolated groups of conductive particles, each group containing a plurality of conductive particles arranged as a single layer;
contacting the layer of particles with a layer of softened adhesive to cause penetration of the particles into the adhesive;
hardening the adhesive, thereby to cause containment of the particles in the adhesive;
removing the hardened adhesive containing the particles and locating it between the first and second bonding pad arrays;
softening the adhesive and compressing the adhesive between the first and second bonding pad arrays, thereby causing it to bond together matching bonding pads and causing individual particles to make simultaneous contact with matching bonding pads on the first and second arrays to interconnect the electronic device to the first substrate.

11. The method of claim 10 wherein:
each of the bonding pads of the first array has an area A;
and each of the groups of conductive particles constitutes an area which is less than 0.5 A.

12. The method of claim 11 wherein:
the step of forming the groups of particles comprises the step of forming a matrix array of ferromagnetic elements and wherein the conductive particles are ferromagnetic conductive particles caused to adhere to the upper surface of each of the ferromagnetic elements.

13. The method of claim 11 wherein:
each bonding pad of the first and second array has length and width dimensions of less than one hundred fifty microns.

14. A method for making anisotropic conductive material comprising the steps of:
using photolithographic masking and etching to form a matrix array of mutually isolated magnetized elements;
causing a layer of ferromagnetic particles to adhere to an upper surface of each of the magnetized elements;
contacting the layer of particles with a layer of softened insulative material to cause penetration of the particles into the insulative material;
hardening the insulative material to cause containment of the particles therein;
and removing the hardened insulative material containing the particles.

15. The method of claim 14 wherein:
the insulative material is a material that is adhesive when it is softened.

16. The method of claim 13 further comprising the step of:
during the adherence of the ferromagnetic conductive particles to an upper surface of each of the magnetized elements, forcing a planar member downwardly onto the upper surface of the conductive particles, thereby to force the conductive particles to distribute as a single layer on the upper surface of each of the magnetized elements.

17. The method of claim 14 wherein the method of forming the matrix array of mutually isolated magnetized elements comprises the steps of:
forming on a second substrate a photosensitive layer;
selectively exposing the photosensitive layer to light;
selectively etching the photosensitive layer to form a mask;
using the mask to selectively plate photomagnetic material on the second substrate, thereby to form ferromagnetic elements;
and magnetizing the ferromagnetic elements.

* * * * *

UNITED STATES PATENT AND TRADEMARK OFFICE
CERTIFICATE OF CORRECTION

PATENT NO. : 5,221,417

DATED : June 22, 1993

INVENTOR(S) : Nagesh R. Basavanhally

It is certified that error appears in the above-indentified patent and that said Letters Patent is hereby corrected as shown below:

Column 1, line 58 "circuit" should read --circuits--. Column 5, line 48 "carried" should read --carries--; Column 5, line 65 "fifth" should read --fifty--; Column 6, line 55 "fifth" should read --fifty--. Column 7, line 52 "on" should read --of--; Column 8, line 13 "array" should read --arrays--.

Signed and Sealed this

Twenty-sixth Day of April, 1994

BRUCE LEHMAN

*Attest:*

*Attesting Officer*      Commissioner of Patents and Trademarks